United States Patent [19]

Borkowicz et al.

[11] Patent Number: 5,422,779
[45] Date of Patent: * Jun. 6, 1995

[54] PACKAGED SOLID-STATE SURGE PROTECTOR

[75] Inventors: Jerzy Borkowicz, Nepean; William P. Trumble, Kanata; James E. Anderson, Almonte, all of Canada; Robin McIntyre, Kanazawa, Japan

[73] Assignee: Northern Telecom Limited, Montreal, Canada

[*] Notice: The portion of the term of this patent subsequent to Jul. 3, 2007 has been disclaimed.

[21] Appl. No.: 91,551

[22] Filed: Jun. 30, 1993

Related U.S. Application Data

[63] Continuation of Ser. No. 545,952, Jul. 2, 1990, abandoned, which is a continuation of Ser. No. 382,131, Jul. 20, 1989, Pat. No. 4,939,619, which is a continuation-in-part of Ser. No. 101,094, Sep. 25, 1987, Pat. No. 4,851,956.

[30] Foreign Application Priority Data

Jan. 26, 1987 [CA] Canada ................... 528200

[51] Int. Cl.⁶ ................ H02H 1/04; H02H 9/04
[52] U.S. Cl. ................... 361/119; 361/56
[58] Field of Search .......... 361/111, 117, 118, 119, 361/56, 54, 57; 357/79, 80

[56] References Cited

U.S. PATENT DOCUMENTS

| | | | |
|---|---|---|---|
| 3,476,979 | 11/1969 | Stumpe et al. | 361/119 |
| 3,646,471 | 2/1972 | DeMent | 331/94.5 |
| 3,849,750 | 11/1974 | Baumbach et al. | 337/32 |
| 3,885,243 | 5/1975 | Weisshaan et al. | 357/79 |
| 3,928,093 | 12/1975 | Van Tongerloo et al. | 148/186 |
| 3,995,310 | 11/1976 | Koenig | 357/79 |
| 4,104,676 | 8/1978 | Bednorz et al. | 357/79 |
| 4,404,614 | 9/1983 | Koch et al. | 361/128 |
| 4,646,037 | 2/1987 | Turolla et al. | 333/182 |
| 4,658,324 | 4/1987 | Inaba | 361/118 |
| 4,658,325 | 4/1987 | Splitt | 361/119 |
| 4,701,825 | 10/1987 | Pagliuca | 361/119 |
| 4,730,229 | 3/1988 | De Luca et al. | 361/119 |
| 4,760,439 | 7/1988 | Borkowicz | 357/39 |
| 4,812,944 | 3/1989 | Eberhard et al. | 361/127 |
| 5,043,838 | 8/1991 | Sakich | 361/117 |
| 5,224,008 | 6/1993 | Popat et al. | 361/56 |

FOREIGN PATENT DOCUMENTS

| | | |
|---|---|---|
| 141179 | 9/1983 | European Pat. Off. |
| 123126 | 10/1984 | European Pat. Off. |
| 2598031 | 10/1987 | France |
| 3113850 | 1/1982 | Germany |
| 3238557 | 4/1984 | Germany |
| 465064 | 11/1968 | Switzerland |
| 2057762 | 4/1981 | United Kingdom |
| WO83/00586 | 12/1985 | WIPO |

Primary Examiner—A. D. Pellinen
Assistant Examiner—Ronald W. Leja
Attorney, Agent, or Firm—Foley & Lardner

[57] ABSTRACT

A solid-state surge protection device comprises a semiconductor chip sandwiched between two electrodes. A resilient sealing member or layer comprised of a thermoplastic or thermosetting resin extends around the periphery of the device, adhering to both electrodes, so as to seal the interface region between the chip and each electrode. The resin is a flexible, dielectric material which is not disrupted by heat generated under surge conditions in the device, is environmentally inert, and preferably remains compliant under extremely cold conditions. The electrodes of the device can move together into electric-conductive contact in the event of chip destruction, or can move back into contact with the chip if separated therefrom by an arc.

17 Claims, 8 Drawing Sheets

PACKAGED SOLID-STATE SURGE PROTECTOR

This application is a continuation of application Ser. No. 07/545,952, filed Jul. 2, 1990, abandoned which is a continuation of Ser. No. 07/382,131, filed Jul. 20, 1989, (now Pat. No. 4,939,619), which is a continuation-in-part of Ser. No. 07/101,094, filed Sep. 25, 1987, (now Pat. No. 4,851,956).

BACKGROUND OF THE INVENTION

The present invention relates to a packaged, solid-state surge protector and to its use in the protection of telecommunication and other electronic systems that are subject to transient current surges of up to $10^4$ amps or more.

Electronic systems often must be protected against transient current surges which might otherwise damage the system. Thus, power-transmission systems and telecommunications systems typically incorporate surge protectors, for example, where conductors enter a central office or a building, whether industrial, commercial or residential, and at various other positions in the system.

Conventional protectors often include a gap across which a surge current shorts to ground, i.e., the protector provides a connection to ground in parallel with the conductor it is protecting, with the gap normally providing isolation. The form of the protector varies. The gap may thus be between two carbon blocks or electrodes, and open to the atmosphere. Alternatively, in so-called "gas tube" protectors the gap may be between two electrodes sealed within a housing, the gap being at a sub-atmospheric pressure.

Surge protectors that incorporate a gap have several drawbacks, including the inherently statistical nature of current conduction across the gap, which are reflected in an undesirable instability. An open-air gap, for example, is subject to contamination which affects conduction across the gap in an unpredictable manner. A gas tube protector can leak, resulting in an increase in internal pressure and breakdown voltage.

Accordingly, it has been proposed to protect electronic systems against surges by means of a unidirectional or bidirectional semiconductor (solid-state) device wherein an avalanche-breakdown phenomenon is exploited to effect a clamp on voltage, as in a zener diode, or a regenerative feedback action, as in a thyristor. A semiconductor device of this sort is typically an overvoltage protector, and is structurally similar to standard, medium-power semiconductor devices like the thyristor.

Unlike standard semiconductor devices, however, a semiconductor overvoltage protection device must fulfill a specific role, both before and after failure, in the circuit where it is a component. In particular, after the device fails (due to a current surge) it must provide a sustained short between the conductors in the circuit of which the device is a part. Also in contrast to standard semiconductor power devices, semiconductor overvoltage protectors normally do not operate in a rapid-repetitive mode, but rather are subjected to transient surges (or to trains of transient pulses which have the effect of a single surge) which vary in duration and amplitude. By virtue of practical limits on heat transfer through a protector device, heat generated by such a transient cannot be removed from the device in a period comparable to the duration of the transient.

Thus, while the average power normally dissipated by a semiconductor protection device is very low, the instantaneous power (and the heat generated) during a transient surge can reach levels sufficient to destroy totally the active (semiconductor) region of the device, which in turn can lead to loss of contact between the conductors and the elimination of the short. Because they are prone to destruction in this fashion at a relatively low current surges, medium-power semiconductor protection devices have heretofore been limited in their use to circuits where maximum surges were well below $10^4$ amps.

SUMMARY OF THE INVENTION

It is therefore an object of the present invention to provide a semiconductor protection device wherein, upon failure, a short is sustained even after very large surges, e.g., on the order of $10^4$ amps or more.

It is also an object of the present invention to provide an electronic system comprising means for protecting the system against large, transient surges that would completely destroy a conventional semiconductor protector.

In accomplishing the foregoing objects, there has been provided, in accordance with one aspect of the present invention, a semiconductor surge protection device comprising a first electrode and a second electrode; a semiconductor chip that is in electrical-conductive relation with the first and second electrodes, respectively, such that an interface region exists between the semiconductor chip and each of the first and second electrodes; and sealing means for sealing the interface region between the semiconductor chip and each electrode, the sealing means comprising a sealing layer that (a) is adhered to both electrodes, (b) defines with the electrodes a cavity wherein the chip is provided, and (c) is comprised of a dielectric resin material that is resilient under both room-temperature and high-heat conditions, wherein the electrodes are capable of moving into a electrical-conductive relation to sustain a short circuit in the event of chip destruction. The resin material in one preferred embodiment comprises a thermoplastic olefin acrylic copolymer, while in another preferred embodiment the resin material is comprised of a thermosetting resin, such as a polyimide elastomer, a polyurethane or a silicone rubber. It is also preferable that the resin material retain its resiliency and structural integrity under conditions of extreme cold, ranging as low as about −40° C.

In accordance with another aspect of the present invention, an electronic system has been provided comprising at least one circuit that includes surge-protecting means for protecting the circuit against a current surge up to $10^4$ amps or more, which surge-protecting means comprises a semiconductor device as described above.

In accordance with yet another aspect of the present invention, there has been provided an overvoltage protector module comprising (A) at least one semiconductor surge protection device as described above; (B) a ground side-conductive pathway that includes a ground terminal and that is connected to the first electrode; (C) a line side-conductive pathway that includes a line terminal and that is connected to the second electrode; and (D) means for biasing the first and second electrodes toward each other so as to sustain a short circuit in the event of chip destruction, wherein components (A), (B), (C) and (D) are in conductive relation such that they together define a voltage-surge protection circuit running from the line terminal to the ground terminal. Means (D) in one preferred embodiment includes a conductive spring. In another preferred embodiment, the ground side-conductive pathway or the line side-conductive pathway further includes a heat-fusible element such that, upon a fusing of the heat-fusible element, a direct connection is effected between the ground side-conductive pathway and the line side-conductive pathway.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be readily understood by the following description of certain embodiments, by way of example, in conjunction with the accompanying drawings, in which.

DETAILED DESCRIPTION OF THE PREFERRED EMBODIMENTS

Figure 1:
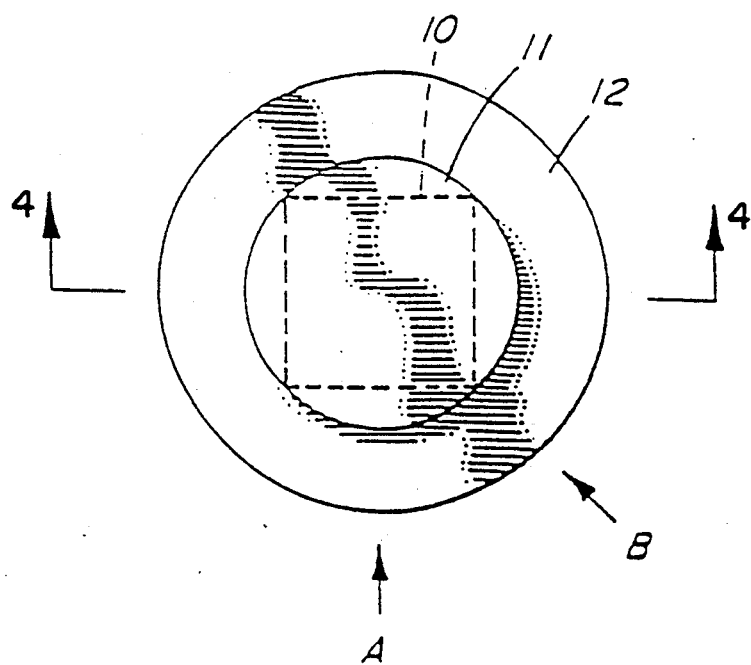
FIG. 1 is a top plan view of a protector device of the present invention, prior to application of a synthetic sealing ring.

The present invention provides a packaged semiconductor protector comprising two electrodes, preferably copper, that have a semiconductor chip sandwiched between them, and means for sealing around the edges of the electrodes so as to prevent undesirable contamination from infiltrating between the chip and the electrodes. In this context, "chip" denotes a semiconductor element, either unidirectional or bidirectional, that functions as a clamping or switching component, such as a zener diode or thyristor.

The sealing means includes a sealing member or layer that extends around the periphery of and partially between the two electrodes, to each of which the layer is adhered. The resin comprising the sealing layer is a dielectric material that is resilient (that is, flexible or pliable) and stable under the high-heat conditions of normal overvoltage (surge-protecting) operation for the device, when temperatures within the device can range as high as 200° to 300° C. (corresponding outside-surface temperature: 100°-150° C.). Since a protector of the present invention may find use in extremely cold environments, it is also preferred that the resin sealant should not crack or separate from the electrodes at temperatures as low as about −40° C.

To enhance its sealant function, the resin should be sufficiently metal-adherent to prevent infiltration of agents that might corrode the metal components of the device, damage the semiconductor chip or conduct leakage currents. Metal-adherency is also needed to maintain a seal between the electrodes during heating, when the electrodes may expand or contract at different rates. In this regard, the resin used for the seal should not unduly stress the chip upon exposure to the aforementioned range of temperature conditions and varying degrees of atmospheric humidity; thus, high humidity conditions should not result in a swelling of the sealant to the extent that the chip is damaged or the fail-short capability of the device is impaired.

The electrodes of the device are positioned along opposite surfaces of the chip, and are separated from the chip, respectively, by a layer that is both heat- and electrically-conductive. An electrode can be soldered to a chip surface, i.e., the aforesaid conductive layer can be a solder layer. Alternatively, an electrode can be placed under mechanical compression to keep it pressed against a chip surface, with a suitably conductive metal foil or coating interposed therebetween.

It has been discovered that the rigid packaging heretofore adapted in the art from use with standard, medium-power semiconductor devices to use with semiconductor protection devices of comparable configuration is, in fact, incompatible with achieving a sustained short in circuits that experience high-amplitude surges of the sort mentioned above. For example, it has been found that the inflexibility of conventional package components and sealing materials precludes the reinstatement of a short circuit, following a surge-induced, explosive destruction surge of the active region in known semiconductor protectors, even with the application of external pressure to the electrodes; that is, failure of a conventional semiconductor protector under high-current conditions generally results in the interposition of rigid packaging fragment or fractured portions of the encapsulated body between the electrodes, preventing a short circuit.

The foregoing problems are overcome in a surge protector within the present invention, which can therefore be used in electronic systems that must be protected against high-current surges, of up to $10^4$ amps or more, that cannot be handled by existing semiconductor protective devices. In a protector configured in accordance with the present invention, the sealing member or layer represents a portion of a cavity, defined by the electrodes and the sealant material, in which to secure the semiconductor chip so as to ensure against package destruction. Also, the resiliency of the sealant material under high-current conditions permits the electrodes to move, under external pressure, into an electrical-conductive relation (typically, direct contact), sustaining a short circuit in the event of chip destruction. If arcing within the device results in separation of the electrodes from the chip, the resiliency of the sealing material also assures that the electrodes will return to electric-conductive contact with the chip.

Figure 2:
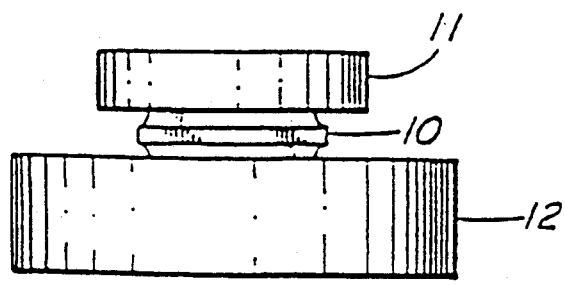
FIGS. 2 and 3 are side views in the direction of arrows A and B, respectively, on FIG. 1.
Figure 3:
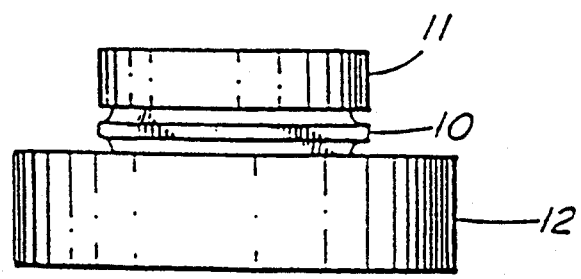

One embodiment of a protector device within the present invention, as illustrated in FIGS. 1, 2 and 3, comprises a semiconductor chip 10 positioned between, and in heat/electrical-conductive communication with, two electrodes 11 and 12, hereafter designated as the upper and lower electrodes, respectively. Each of the electrodes can be connected to the chip by a layer of solder, as will be described below in relation to FIGS. 4 and 5, or separated from the chip by a metal foil or coating against which the electrode is pressed. The thermal response of the protective device to repetitive transients of non-destructive amplitude can be controlled, pursuant to the present invention, by adjusting total electrode mass and thickness, as described in greater detail below. When solder is used, affecting thermal resistance and transient thermal impedance, the thickness of the solder layer also influences the thermal response of the protector.

In the arrangement illustrated in FIGS. 1–3, chip 10 is square in plan form, although it can be round or such other shape as desired. Chip 10 can be a silicon-based semiconductor chip having a structure similar to that of the device disclosed in U.S. Pat. No. 3,928,093, the contents of which are hereby incorporated by reference. The specific structure of the chip is not critical, however, so long as the above-described function with regard to avalanche breakdown is fulfilled.

Electrodes 11 and 12 are preferably copper, but can comprise any suitably conductive metal or alloy (brass, aluminum, etc.). The electrodes can also be plated, for example, nickel-plated.

The shape and relative dimensions of the electrodes are selected, respectively, to provide for self-support of the assembly, thereby permitting the use of a thermoplastic or thermoset resin to comprise the sealing layer as described herein. The electrodes can be of the same approximate area, but one can also be larger than the other, as the presence of a larger electrode provides a surface on which to apply the viscous resin during assembly and enables the surface tension of the liquid resin to wick the resin into the gap between the electrodes. For this reason, the use of a larger and a smaller electrode is useful when a preformed ring of resin is applied by reflowing or the resin is introduced via syringe or other dispenser system, as described in greater detail below.

Figure 13A:
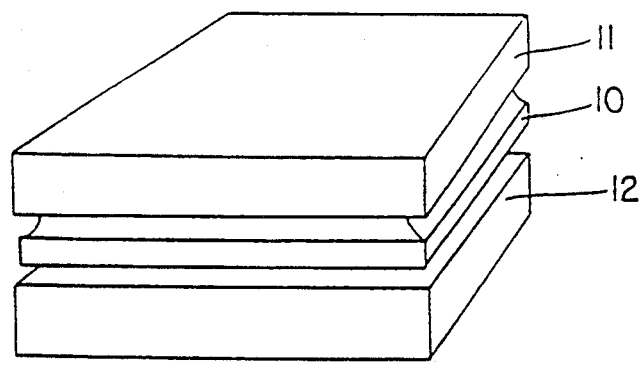
FIGS. 13A-C provides schematic perspective (A) and top (B) views, and cross-sectional view FIG. 13(C) or 13(C) along line 4—4 in FIG. 13(B), of another embodiment of the present invention, wherein the electrodes of the protector device are polygonal in shape.
Figure 13B:
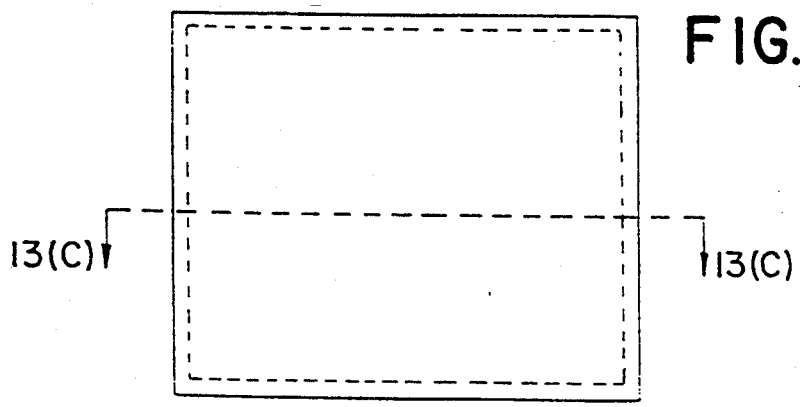
Figure 13C:
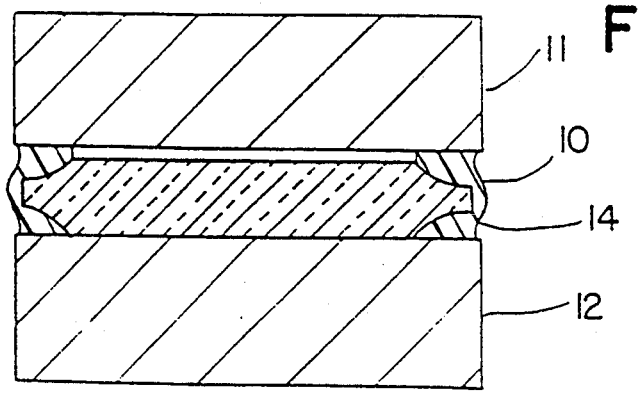

In FIGS. 1 to 6, electrodes 11 and 12 are shown as circular in plan form. Generally, this "button" configuration is the most convenient shape, particularly when protectors according to the present invention are to be used as retrofit devices in existing protector modules. But the electrodes can be of other shapes, such as square, hexagonal, triangular or oval in plan form. An exemplary "non-button" device within the present invention is shown in FIG. 13, where the electrodes 11, 12 are polygonal in shape and the same size. It is not essential, however, that both electrodes have the same plan form, so long as each electrode covers the entire planar chip surface it faces.

Figure 14A:
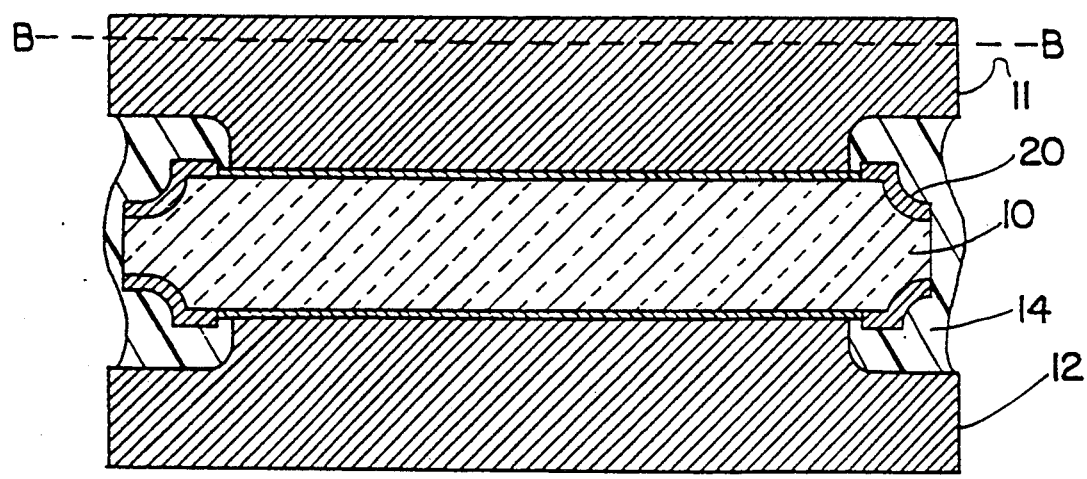
FIG. 14 provides a side view of two versions of the inventive protector device which incorporate "raised-pedestal" electrodes having a single-sided (A) or a double-sided (B) configuration.
Figure 14B:
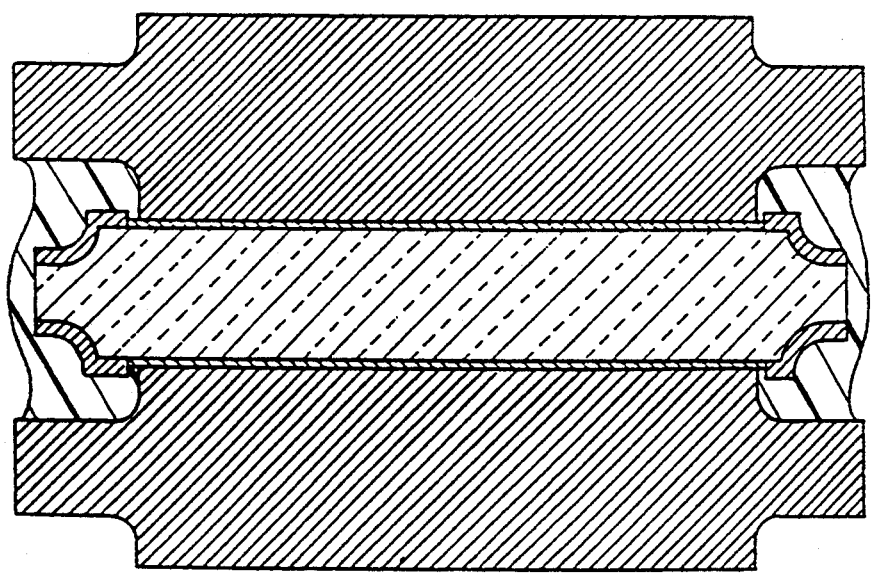

The electrodes of a protective device within the present invention can also be provided in "raised-pedestal" configuration, as illustrated in FIG. 14. In this configuration, the electrode surface that is adjacent to the planar chip surface is smaller in area than a cross section taken longitudinally through the middle of the electrode (that is, along line B—B in FIG. 14A). The electrode thus narrows, from midsection toward the adjoining chip surface, in a manner such that an integral "pedestal" portion is formed. The narrowing of the electrode, in the direction of the chip, typically follows an arcuate path, and each of the electrodes is positioned adjacent a planar chip surface, as shown in FIG. 14, so that an edge of the planar chip surface can be overlapped by a passivation coating 20 (see description regarding FIG. 6). Separation by resin sealant 14 of coating 20 from electrodes 11 and 12, respectively, serves to protect coating 20 from forces applied to the electrodes.

In the single-sided version of the raised-pedestal configuration (FIG. 14A), the electrode narrows only on the side facing the chip. Since this version requires orientation of the electrode, relative to the chip, during assembly, a double-sided version, in which there is a narrowing on both sides of the electrode (FIG. 14B), is preferred when random-oriented parts are used.

Figure 4:
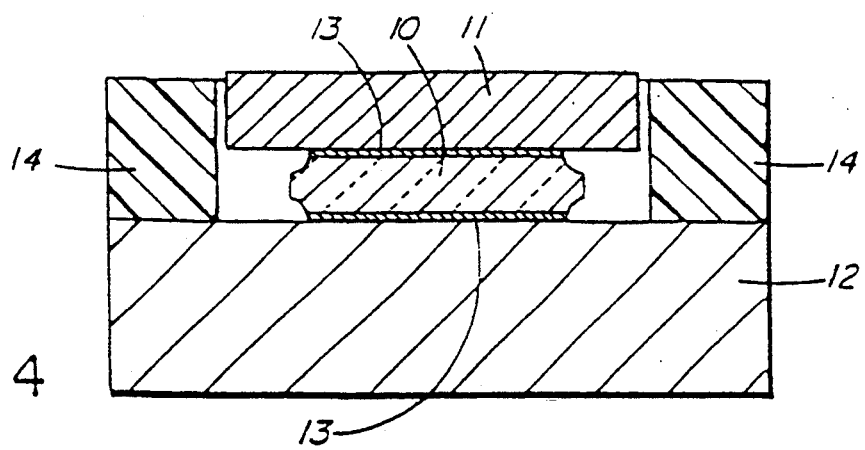
FIG. 4 is a cross-section as on the line 4—4 of FIG. 1, but with an annular ring of synthetic resin in position.
Figure 5:
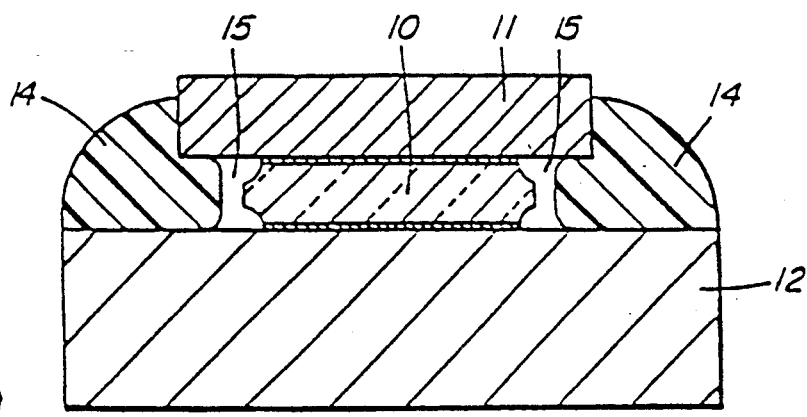
FIG. 5 is a cross-section similar to that of FIG. 4, but after the synthetic resin ring has been heated and has flowed to adhere to the electrodes.

FIGS. 4 and 5 illustrate, to a larger scale, the arrangement of a semiconductor overvoltage protection device within the present invention. Seen in FIGS. 4 and 5 are the solder layers 13 which connect electrodes 11 and 12 to the chip 10. Also evident in FIG. 4 is annular sealing member 14. FIG. 5 illustrates the arrangement after the assembly has been heated, with the sealing member having moved into the gap between the electrodes and having become adhered to the electrodes. As previously mentioned, the electrodes 11, 12 and sealing member 14 define a cavity wherein chip 10 is positioned, and a small gap or bubble 15 may remain between the resin member or layer and the chip 10, for example, when no vacuum is applied during resin-flow application (see below).

Figure 6:
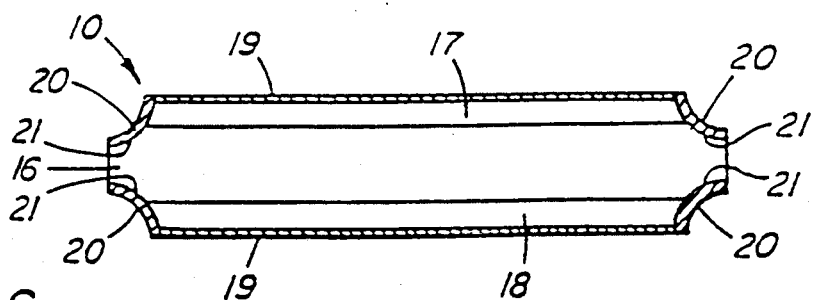
FIG. 6 is a diagrammatic cross-section through one form of solid state chip, as used in the arrangement of FIGS. 1 to 5.

FIG. 6 illustrates a typical form of chip 10, comprising a central silicon part 16 of one conductive type, such as N type, with outer layers 17 and 18 of the opposing (P) type. Local areas of N type (not shown) are formed in the P layers 17 and 18. A layer 19 of nickel or other solder-acceptable material is formed on each of the layers 17 and 18, the layers 19 providing electrical connection and a surface that will permit soldering to the electrodes 11 and 12. A fused-glass or similar passivation coating 20 is normally formed at the curved edges 21 of the chip 10.

For assembly purposes, the resin comprising the sealant should completely wet the metal interfaces of the protective device, and form an adhesive bond with the metal electrodes, without flowing out of the gap between the electrodes. As described below, this can be accomplished by use of a thermoplastic ring 14 that actually melts during application, changing to a viscous liquid when heated, and flows into the gap between the electrodes before rehardening. The ring also assumes a rounded outer periphery, viewed in cross-section (see FIG. 5).

Figure 15:
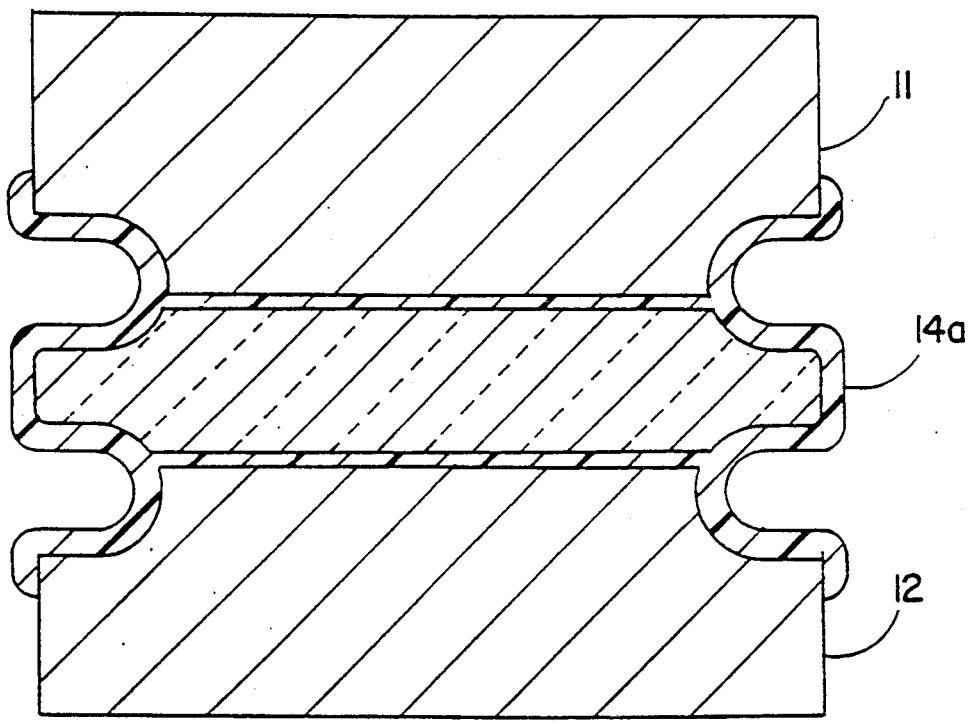
FIG. 15 is a cross-section illustrating an embodiment of the present invention wherein a thin layer of thermosetting material seals the interface regions between the chip and upper and lower raised-pedestal electrodes, respectively.

As an alternative to using such a preformed, thermoplastic-resin ring, a sealing layer can be formed with a thermoset resin. Such a layer need only be thick enough to effect the sealing described above while not acting to wedge the electrodes apart in the event of a device-damaging current surge. Such a sealing layer 14a is shown in FIG. 15, where a protective device within the present invention is illustrated that incorporates electrodes 11, 12 having the single-sided, raised-pedestal configuration described above; other electrode configurations could also be employed in conjunction with a sealing layer of this sort.

The thermoset resin can be applied, in uncured liquid form, by painting or spraying the resin onto the device, or by dipping the device into the resin, after first masking off surfaces of the electrodes which are to remain free of resinous coating. Alternatively, the entire device can be coated, without masking, and appropriate point contacts provided within the module to penetrate the resultant coating when the device electrode is pressed against the module contact under pressure (see, e.g., the description below concerning FIG. 9). Another approach entails using a dispenser to inject the resin at a location along the edge of an electrode, and then allowing surface tension to draw the resin around and fill the electrode/chip interstitial space. The resin can also be injected in a mold within which the device is appropriately positioned. A partial vacuum can be applied in any event, during resin-flow application, to improve filling of the interface regions and, hence, the seal thereby created.

Sealing member 14 therefore must adhere strongly to the metal electrodes, in addition to being dielectric and remaining flexible over a wide temperature range, and must not wedge open the electrodes with high resistivity or insulating material, even upon explosive device failure. No high-resistivity foreign matter should enter between the electrodes, affecting the short which must be maintained upon device failure.

By the same token, the resin used should not corrode any metallic element in the protector, a requirement militating against the inclusion of inorganic components (sulfate, alkali-metal, nitrate, etc.) in the sealant material. Processing aids, such as tackifiers and plasticizers, and other additives that might volatilize under high-wattage conditions are likewise not preferred.

Suitable resins to use in the present invention can be selected, in satisfaction of the foregoing criteria, from thermoplastic resins and thermoset resins that are soft at room temperature and that remain soft when exposed to high-heat conditions and, preferably, to low-temperature conditions as well. Exemplary of suitable thermoplastic resins are the known olefin acrylic copolymers, including copolymers containing ethylene acrylic acid, ethylene methacrylic acid monomers, propylene acrylic acid monomers, and propylene methacrylic acid monomers. These olefin acrylic copolymers readily adhere to the metal electrodes, are flexible, display dielectric properties and are stable.

Among the thermoplastic resins, the ethylene-acrylic acid copolymers are particularly suitable for use in the present invention. It is a feature of such copolymers that a larger proportion of acrylic acid is associated with higher adhesiveness and pliability. The acrylic acid raises the melt index of the resin and lowers the viscosity in the liquid state. One especially useful resin from this group is an ethylene-acrylic acid copolymer comprising from about 6% to about 30% acrylic acid, especially about 20% acrylic acid, in terms of molecular ratio. Representative of such a copolymer are the PRIMACOR family of adhesive resins manufactured by the Dow Chemical Company (Midland, Mich. USA).

Illustrative of suitable thermoset resins are polyimide elastomers, polyurethanes, and silicone rubbers meeting the above-described selection criteria. The suitable polyimide elastomers are exemplified by the pre-imidized polyimide resin "ProbeImide 348" (product of Ciba-Geigy Corp., Auwthorne, N.Y.) and the polyamic acid precursor resin PI2525 (product of E.I. dupont de Numours & Co., Willmington, Del. Representative of the polyurethanes suitable for use in accordance with the present invention are those produced using a diphenylmethane diisocyanante and a polyether polyol. Such resins make up the "Uralane" family of polyurethanes manufactured by Furane Corporation (Los Angeles, Calif.), including Furane's product No. 5753A/B.

Particularly preferred among the silicone rubbers are one- or two-component, room-temperature-vulcanizing (RTV) silicone resins like the moisture-resistant DOW CORNING 3-6550 and Q1-4939 thermoset resins (products of Dow Corning Company (Midland, Mich. USA)). RTV resins are stable under adverse conditions, resisting thermal extremes (flexibility retained at $-40°$ C., for example) and the effects of radiation, weather and chemicals, and adhere to metals as well as many other substrates. In uncured form, the typical RTV formulation—there are three formulation types: acetoxy, alkoxy and "neutral-cure"—has good wetting properties and, hence, can be applied by spraying, dipping, painting or injection, as mentioned above.

One-component RTV systems generally cure, at room temperature, by means of a condensation reaction with atmospheric moisture which releases such by-products as acetic acid (from acetoxy formulations), methanol (from alkoxy and neutral-cure formulations) and ammonia (neutral-cure formulations). Since acetic acid is conductive and can contribute to the corrosion of metals, acetoxy RTV formulations are less preferred for use in the present invention. Curing of an RTV resin in the present invention can also be effected by means of an ultraviolet-sensitive constituent added to the RTV formulation, such that cure begins when the resin material is exposed to ultraviolet light.

Other polymers can also be used so long as they meet the above-mentioned criteria of activating adhesively below the solder temperature, maintaining flexibility and stability at operating temperatures, and the like. Some acrylic epoxies, urethanes, polyamides, polyimide/epoxy mixtures, silicone-polyimides and styrenes will work, for example, but suitable olefin acrylic copolymers and RTV silicone resins are both environmentally inert and readily available. By contrast, other resins require special formulation and are not so readily available, and are generally more costly.

Figure 7:
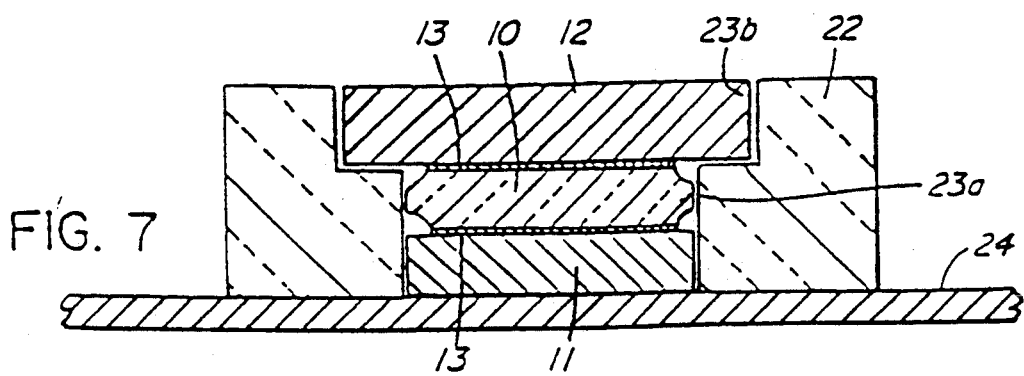
FIG. 7 is a cross-section illustrating one way of assembling electrodes and device.

FIG. 7 illustrates one method for assembling a protector within the present invention. A smaller electrode 11 is positioned in an annular ceramic member 22 having bores 23a and 23b, bore 23a being of a diameter to accept electrode 11 with a fairly close fit. Being located by the corners, chip 10 is placed on electrode 11. Larger electrode 12 is then positioned in the ceramic member 22, being a fairly close fit in bore 23b. The surfaces of electrodes 11 and 12 which contact chip 10 are coated beforehand with solder; alternatively, the surfaces of chip 10 are coated, or even electrode and device coated, or solder preforms can be used.

In FIG. 7, the assembly of electrodes, chip and ceramic member rests on a support member 24. Heating melts the solder and fuses the chip and electrodes together. The support member itself can be the heating member, or the assembly can moved on a conveyor over a heating member or through a furnace, for example. After the solder sets, the assembly is removed from the ceramic member. Ring 14 is positioned on electrode 12 and, after the whole assembly is turned over, heating causes the resin to flow, adhering to the electrodes and sealing the assembly.

The assembly can also be soldered with the large electrode 12 on the bottom, but by positioning the large electrode on the top, as in FIG. 7, the weight of the large electrode provides a useful loading during soldering.

When protectors of the present invention are to be retrofitted to existing protector modules, certain overall dimensional limitations apply, such as external diameter and, possibly, overall height or thickness. When used as original equipment, such as in modules specifically designed to use the protector of the present invention, then the various parameters relating to designing the protector itself apply.

In this regard, it was indicated above that the thermal response of a protector within the present invention is partially a function of electrode mass and thickness. More specifically, it can be assumed, for design purposes, that there is no heat exchange between the protective device and the environment; accordingly, the greater the total electrode mass (and the larger the heat-sink capacity) of the device, the longer is the projected service life of the device. In practice, therefore, the upper limit on electrode mass (and, concomitantly, on electrode thickness) is determined by economic considerations, such as the cost of the chosen electrode metal.

At the lower limit, on the other hand, electrode thickness must be such as to accommodate the heat generated by the slowest transients experienced in the particular system incorporating a protective device of the present invention. A convenient standard for slow transients in this regard is the so-called "10×1000" pulse, which has a rapid leading edge (exponentially rising to about 90% maximum value within 10 $\mu$sec) and a delayed falling edge (exponentially declining to about 50% maximum value within 1000 $\mu$sec). When the conductive layer between a metal electrode and the chip of the protective device is pure metal or a suitably conductive metal alloy, rather than solder, the minimum useful electrode thickness approaches the lower limit on thickness determined for the theoretical ideal, i.e., for a device wherein electrode and chip contact directly. With a copper electrode and the 10×1000 pulse as standard, this ideal lower limit, which can be approached when non-solder conductive layers are employed, corresponds to an electrode thickness (i.e., along the axis of the device) of about 20 mil.

When a solder layer is used in order, for example, to accommodate a difference in expansion coefficients between chip material and the selected electrode metal, the effective heat-sinking capacity of the electrode is reduced by the substantially lower heat-conductivity of the solder layer. In particular, less of the heat generated by even a slow transient is conducted through the solder layer to the electrode over the duration of the transient, thereby reducing the heat-absorbing effect of a thicker electrode, i.e., the minimum useful electrode thickness is reduced.

For purposes of optimizing the mechanical stability of a device within the present invention, it has been found that a solder layer having a thickness between 0.3 and 3 mil, and especially between 0.3 and 1 mil, is employed to advantage. With a copper electrode and a 10×1000 standard transient, the minimum useful electrode thickness is about 16 mil when a 0.3-mil solder layer is employed, and about 9 mil with a solder layer of about 1 mil in thickness. In a device as illustrated in FIGS. 1–5, where one electrode is larger than the other, preferred thicknesses for the upper (smaller) and lower electrodes is 40 and 60 mil, respectively. Where the electrodes are similarly sized, electrode thickness is preferably about 40 mil.

These illustrative values for layer thicknesses would be adjusted, in accordance with the foregoing description, to accommodate design choices as to electrode metal and conductive-layer material, as well as to the nature of slow transients experienced in the electronic system of interest. Alternatively, electrodes of a standard thickness, say, of about 10 mil, in a "prepackaged" module which can be provided with an additional heat-adsorbing element to adapt the module, as necessary, to the repetitive surge conditions anticipated in a given system.

Figure 8:
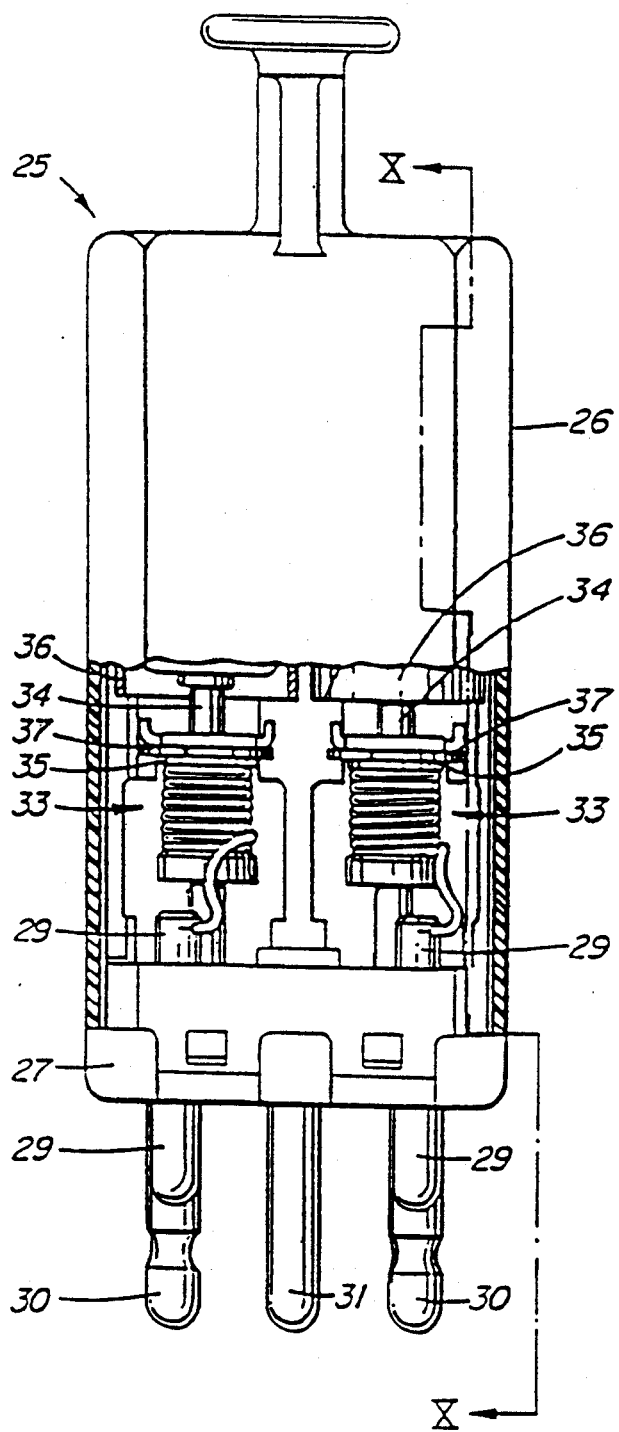
FIG. 8 is a front view, partly in section, of one form of conventional protector module incorporating the present invention.
Figure 9:
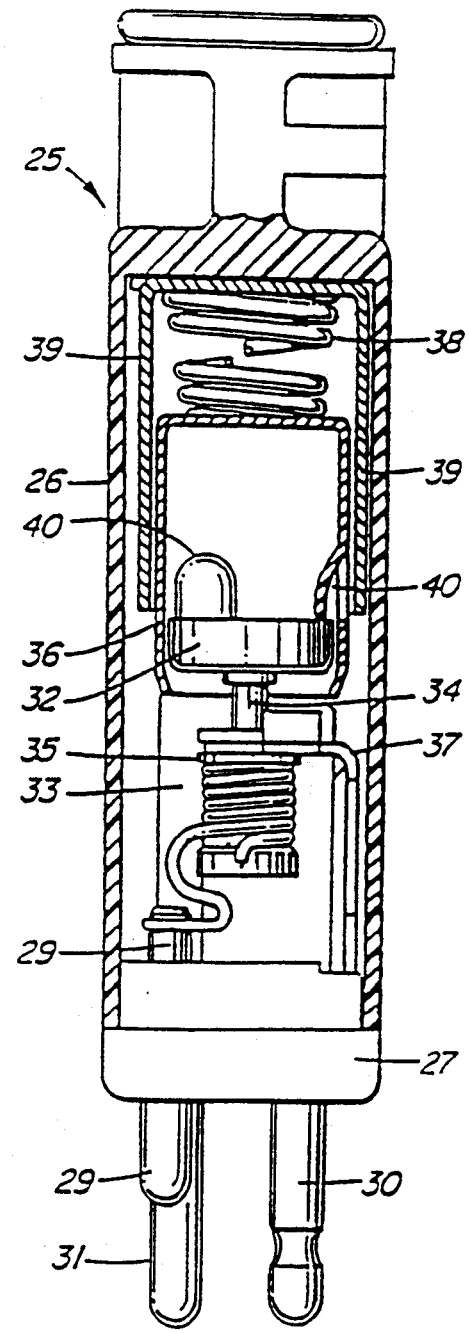
FIG. 9 is a cross-section on the line X—X of FIG. 8.

A device of the present invention, as described and illustrated above, can be manufactured to replace other protectors, and to be retrofitted to existing protector modules. FIGS. 8 and 9 illustrate the application, in one form of protector module, of protectors within the present invention. The module 25 is exemplary of protector modules having two protectors for protecting both conductors of a telephone line. It comprises a housing 26, open at its lower end, and a base 27 which is attached to the lower end. Two pairs of line terminals 29 and 30 are provided in the base, plus a ground terminal 31. In the example, there is both a primary overvoltage protector 32, which is of the form as illustrated in FIG. 5, and a heat coil unit 33, which is in series in the telephone line between terminals 29 and 30. Heat coil unit 33 has a central pin 34 soldered to spool 35 of the heat coil. With the onset of an overcurrent condition, or a sustained overvoltage, the solder joint melts and pin 34 moves down, permitting a cup 36 to move down and contact a line contact 37 connected to line terminal 30.

Figure 10:
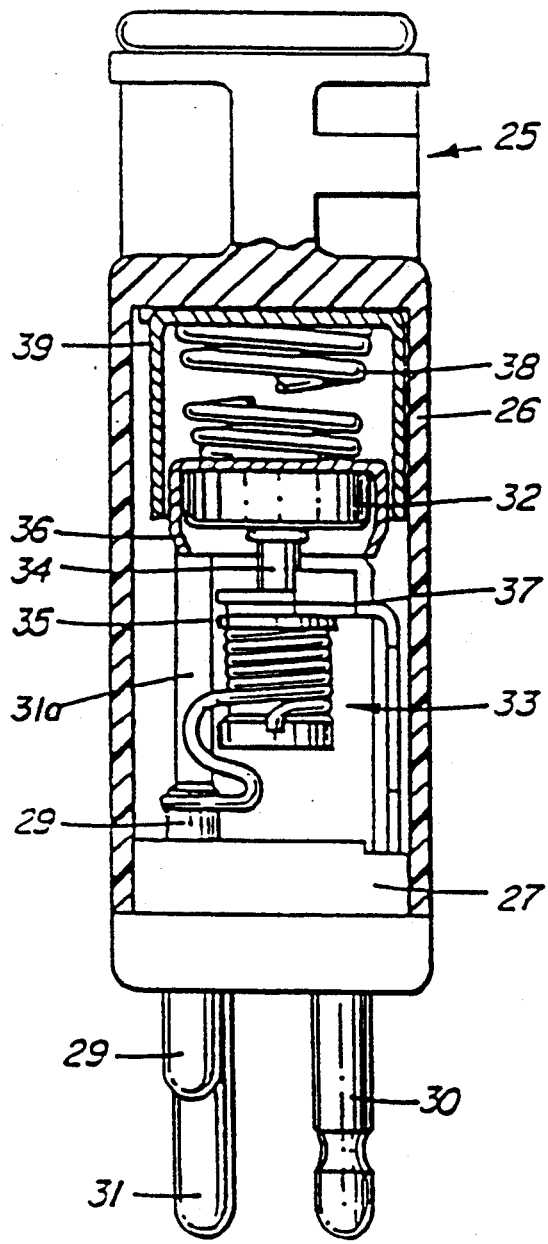
FIG. 10 is a cross-section, similar to that of FIG. 9 but illustrating a protector module more specifically designed to incorporate the present invention.

Normally positioned within cup 36 is a carbon block or a gas tube protector. Under an overvoltage condition, breakdown across a gap in the protector occurs, thus providing a path from pin 34 through the protector to cup 36, through spring 38 to ground member 39, which is also connected to ground terminal 31 via ground contact 31a (FIG. 10). In the example illustrated, cup 36 has been modified by the forming of a number of indents 40, for example, three. These indents are positioned such that protector 32 is held with electrode 11 (FIGS. 1 to 5) in contact with the top end of pin 34. The contact surface of electrode 11 is at the same level, as would be the contact surface of the electrode of a conventional protector. Electrode 12 (FIGS. 1 to 5) of protector 32 is in contact with the indents 40 and, hence, in contact with cup 36. Primary protection for overvoltage surges is thus through pin 34, protector 32, cup 36, spring 38, ground member 39 and ground contact 31a. Overcurrent protection is as previously described, by melting of a solder joint permitting movement of cup 36 down to line contact 37.

Instead of indenting cup 36, at 40, a normal cup can be used, together with a spacer or a spring, to hold protector 32 at the correct position. If protector 32 was coated with resin, via a spraying, painting or dipping operation as described above, the point contacts needed for penetrating the resin coating could take the form of sharpened portions, respectively, of pin 34 and indents 40.

Module 25 can be redesigned so as to take advantage of the reduced height of the protector 32 as compared to a conventional carbon block or gas tube protector. Cup 36 can be much shorter, sufficient to house the protector. Such a reduction in height can be particularly useful where two protectors are mounted in line in a module, rather than side-by-side as in the example.

Figure 11:
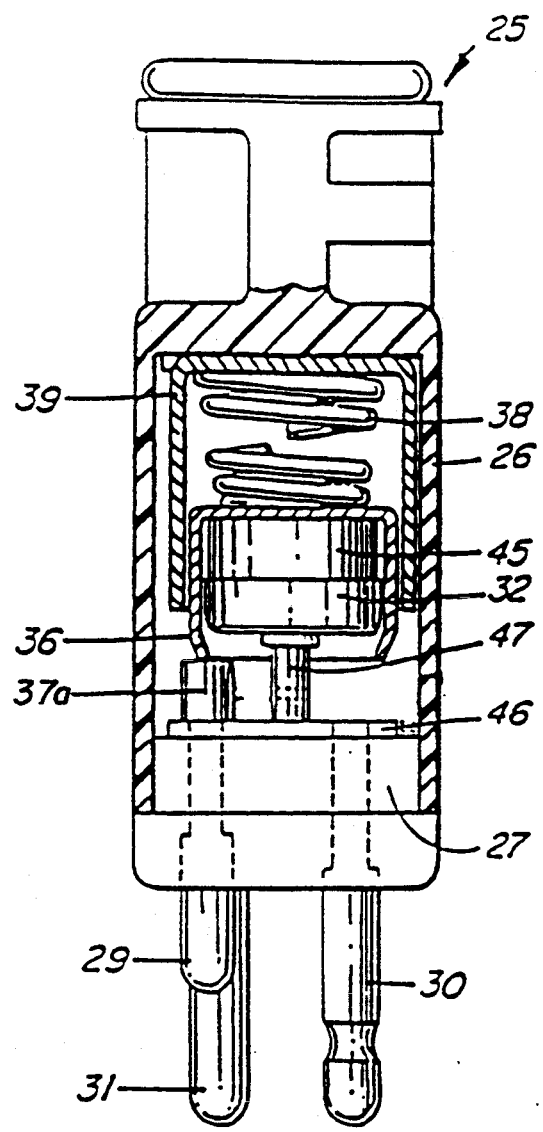
FIG. 11 is a cross-section, similar to that of FIG. 10, but of a protector module without a heat coil subassembly.

FIGS. 10 and 11 illustrate two exemplary forms of module specifically arranged to accommodate protector devices in accordance with the present invention. (Where practical, the same reference numerals are used for items common with FIGS. 8 and 9.) FIG. 10 shows a module which includes a heat coil, while the module depicted in FIG. 11 lacks a heat coil but incorporates a fusible pellet.

As illustrated in FIG. 10, module 25 has a housing 26, open at its lower end, and a base 27 attached to the lower end. Line terminals 29 and 30, and a ground terminal 31, are provided in the base. In this example, there are both a primary overvoltage protector 32 and a heat coil unit 33. The heat coil unit is in series in the telephone line between terminals 29 and 30. The heat coil unit has central pin 34 soldered to spool 35, and on occurrence of an overcurrent condition, or of a sustained overvoltage, the solder joint melts and the pin moves down, permitting cup 36 to move down and contact line contact 37, which is connected to the line terminal 30.

The difference between the arrangement of FIG. 10 and that of FIG. 9 is that cup 36 in FIG. 10 is considerably shorter than in FIG. 9. The cup need only be long enough to house protector 32. This enables housing 26 also to be shorter.

FIG. 11 illustrates a module 25 which does not have a heat coil unit. It comprises housing 26, open at its lower end, and base 27 attached to the lower end of the housing. The base has line terminals 29 and 30 and ground terminal 31. The overvoltage protector 32, as in FIG. 5, is positioned in cup 36. A pellet 45 is positioned behind protector 32 in cup 36, the pellet being of a fusible alloy. A shunt 46 connects the line terminals 29 and 30, and a pin 47 extends up from the shunt and is in contact with electrode 11 (FIGS. 1 to 5) of the protector 32. The other electrode 12 (FIGS. 1-5) is in contact with the cup 36. Upon the instance of an overvoltage condition, breakdown across protector 32 occurs, to pellet 45, cup 36 and spring 38, and then to ground member 39. In the event of a sustained overvoltage condition, the pellet 45 melts and the cup 36 moves down and contacts the contact 37a.

The actuation of the examples in both FIG. 10 and FIG. 11 is conventional, the difference being the use of solid state protector 32, instead of a more usual carbon block or gas tube protector. This enables a considerable reduction in height of the complete module.

Figure 12:
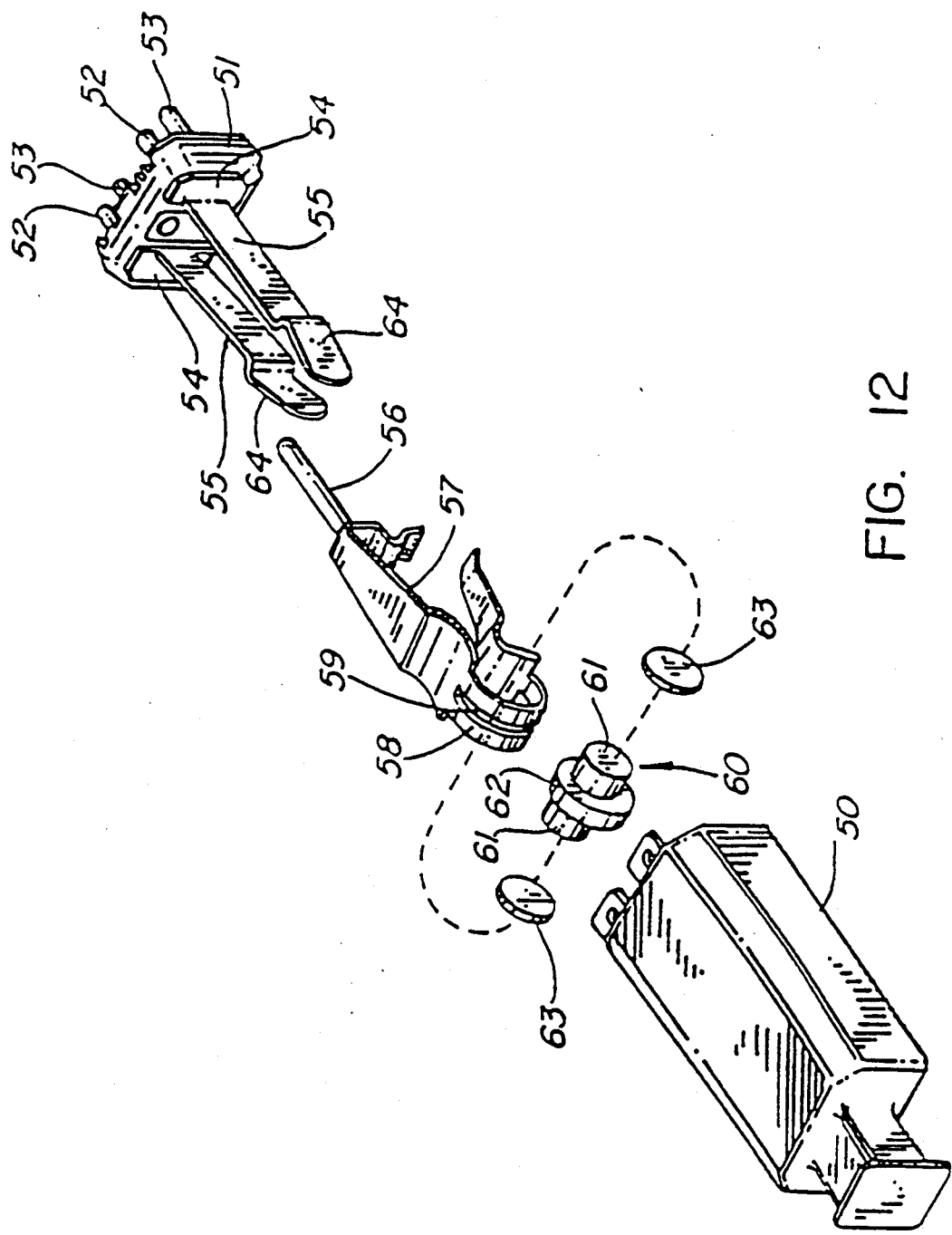
FIG. 12 is an exploded perspective view of another form of protector module, incorporating the present invention.

FIG. 12 illustrates the application of the invention to a further form of protector module, often referred to as a three-electrode module. The module comprises a housing 50 and a base 51 attaching to an open end of the housing. In the base are line terminals 52 and 53, with a shunt 54 connecting each pair of line terminals. Extending from each shunt is a spring cantilever contact member 55. Also mounted in the base is a ground terminal 56, carrying a contact member 57. At the end remote from the terminal 56, contact member 57 is formed into a cylindrical shape 58, which is slotted at 59. Positioned in the cylindrical shape 58 is a protector 60. Protector 60 comprises two solid state devices 61, as in FIGS. 1 to 5, back to back, with a central electrode 62 which fits into slot 59. In this arrangement, electrodes 12 (FIGS. 1 to 5) are effectively connected together. Two fusible pellets 63 are positioned one on each side of protector 60, making contact with electrodes 11 (FIGS. 1–5). When assembled, with ground terminal 56 in base 51, the protector 60 and pellets 63 are also held between the free ends 64 of the cantilever contact members 55. Normal overvoltage surges are shunted to ground by breakdown of one or both of the solid-state devices 61 to ground, to electrode 62, contact member 57 and terminal 56. On a sustained overvoltage condition, fusion of one or both pellets 63 will enable one or both contact members 55 to contact ground member 57.

What is claimed is:

1. A telecommunications equipment overvoltage protector module comprising
   (A) at least one semiconductor surge protection device comprising a first electrode and a second electrode; a semiconductor chip that is in electrical-conductive relation with said first and second electrodes, respectively, such that a region exists between said first and second electrodes; and sealing means for sealing said region, said sealing means comprising a sealing layer that (i) is adhered to both electrodes, (ii) defines with said electrodes a cavity wherein said chip is provided, and (iii) is comprised of a dielectric resin material that is resilient under both room-temperature and high-heat conditions, wherein under explosive chip failure said electrodes move into an electrical-conductive relation to sustain a short circuit in the event of chip destruction;
   (B) a ground side-conductive pathway that includes a ground terminal and that is connected to said first electrode;
   (C) a line side-conductive pathway that includes a line terminal and that is connected to said second electrode; and
   (D) means for biasing said first and second electrodes toward each other so as to sustain a short circuit in the event of chip destruction, wherein components (A), (B), (C) and (D) are in conductive relation such that they together define a telecommunications equipment voltage-surge protection circuit running from said line terminal to said ground terminal.

2. An overvoltage protector module according to claim 1, wherein means (D) includes a conductive spring.

3. An overvoltage protector module according to claim 1, wherein one of said ground side-conductive pathway and said line side-conductive pathway further includes a heat-fusible element such that, upon a fusing of said heat-fusible element, a direct connection is effected between said ground side-conductive pathway and said line side-conductive pathway.

4. An overvoltage protector module according to claim 3, wherein means (D) includes a conductive spring that biases said heat-fusible element toward establishment of said direct connection.

5. An overvoltage protector module according to claim 3, wherein (i) said module includes a pair of line terminals and (ii) said line side-conductive pathway further includes a line circuit connecting said pair of line terminals.

6. An overvoltage protector module according to claim 1, wherein said module comprises a plurality of semiconductor surge protection devices which are maintained by said means (D) in an electrical-conductive relation with each other.

7. An overvoltage protector module according to claim 1, wherein said dielectric resin material is resilient in a temperature range as low as −40° C.

8. An overvoltage protector module according to claim 1, wherein said resin material comprises a thermoplastic olefin acrylic copolymer.

9. An overvoltage protector module according to claim 8, wherein said copolymer comprises a monomer from the group consisting of an ethylene acrylic acid, an ethylene methacrylic acid, a propylene acrylic acid and a propylene methacrylic acid copolymer.

10. An overvoltage protector module according to claim 9, wherein said copolymer is an ethylene acrylic acid copolymer containing from about 6% to 30% acrylic acid.

11. An overvoltage protector module according to claim 10, wherein said ethylene acrylic acid copolymer contains about 20% acrylic acid.

12. An overvoltage protector module according to claim 1, wherein said resin material comprises a thermosetting resin.

13. An overvoltage protector module according to claim 12, wherein said thermosetting resin is selected from the group consisting of a polyimide elastomer; a polyurethane, and a silicone rubber.

14. An overvoltage protection module as recited in claim 1, wherein:
each of said electrodes comprises a conductive pedestal, each said conductive pedestal comprising a substantially flat interior projecting portion and an indented exterior portion, such that said interior portion projects from said indented portion;
said pedestals face each other to form said cavity;
said semiconductor chip is arranged in said cavity so that an interior portion of said chip makes contact with each of said substantially flat interior projecting portions of said electrodes and exterior edge portions of said chip at least partially overhang said indented exterior portions of said electrodes; and
said resin sealing said cavity is arranged to make contact with said indented exterior portions of said electrodes and with said exterior portions of said chip overhanging said indented exterior portions of said electrodes.

15. An overvoltage protector module as recited in claim 14, wherein said resin substantially fills an area bounded by said indented portions of said electrodes.

16. An electronic system comprising at least one circuit that includes telecommunications equipment surge-protecting means for protecting said circuit against a current surge up to $10^4$ amps or more, said telecommunications equipment surge-protecting means comprising a first electrode and a second electrode; a semiconductor chip that is in electrical-conductive relation with said first and second electrodes, respectively, such that a region exists between said first and second electrodes; and sealing means for sealing said region, said sealing means comprising a sealing layer that (a) is adhered to both electrodes, (b) defines with said electrodes a cavity wherein said chip is provided, and (c) is comprised of a dielectric resin material that is resilient under both room-temperature and high-heat conditions, wherein under explosive chip failure said electrodes move into an electrical-conductive relation to sustain a short circuit in the event of chip destruction.

17. A telecommunications equipment semiconductor surge protection device comprising a first electrode and a second electrode; a semiconductor chip that is in electrical-conductive relation with said first and second electrodes, respectively, such that a region exists between said first and second electrodes; and sealing means for sealing said region, said sealing means comprising a sealing layer that (a) is adhered to both electrodes, (b) defines with said electrodes a cavity wherein said chip is provided, and (c) is comprised of a dielectric resin material that is resilient under both room-temperature and high-heat conditions, wherein under explosive chip failure said electrodes move into an electrical-conductive relation to sustain a short circuit in said protection device in the event of chip destruction.

* * * * *